United States Patent
Donlin et al.

(10) Patent No.: US 7,062,586 B2
(45) Date of Patent: Jun. 13, 2006

(54) METHOD AND APPARATUS FOR COMMUNICATION WITHIN A PROGRAMMABLE LOGIC DEVICE USING SERIAL TRANSCEIVERS

(75) Inventors: Adam P. Donlin, Los Gatos, CA (US); Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/420,418

(22) Filed: Apr. 21, 2003

(65) Prior Publication Data

US 2005/0021749 A1     Jan. 27, 2005

(51) Int. Cl.
*G06F 13/38* (2006.01)
*H03K 19/177* (2006.01)

(52) U.S. Cl. .................. 710/305; 710/317; 716/12; 326/39

(58) Field of Classification Search ............ 710/8, 710/305, 316, 317; 716/12, 14, 16, 17; 326/37–41
See application file for complete search history.

(56) References Cited

U.S. PATENT DOCUMENTS

| | | | |
|---|---|---|---|
| 5,423,050 A * | 6/1995 | Taylor et al. ............... 714/31 |
| 5,576,554 A * | 11/1996 | Hsu ........................... 257/48 |
| 5,869,982 A | 2/1999 | Graf |
| 5,883,525 A * | 3/1999 | Tavana et al. .............. 326/39 |
| 5,917,337 A * | 6/1999 | Graf .......................... 326/40 |
| 6,057,708 A | 5/2000 | New |
| 6,097,221 A * | 8/2000 | Sako ......................... 326/113 |
| 6,240,471 B1 | 5/2001 | Schlueter et al. |
| 6,317,804 B1 * | 11/2001 | Levy et al. ................. 710/305 |
| 6,370,603 B1 | 4/2002 | Siverman et al. |
| 6,646,466 B1 * | 11/2003 | Coppola et al. ............. 326/41 |
| 6,650,141 B1 * | 11/2003 | Agrawal et al. ............. 326/41 |
| 6,654,946 B1 * | 11/2003 | Eneboe et al. .............. 716/18 |
| 2003/0023912 A1 | 1/2003 | Lesea |
| 2003/0062922 A1 * | 4/2003 | Douglass et al. ............ 326/39 |
| 2003/0110339 A1 * | 6/2003 | Calvignac et al. ........... 710/305 |

FOREIGN PATENT DOCUMENTS

EP     1 248 372 A2    10/2002
WO     WO 03/010940 A2   2/2003

OTHER PUBLICATIONS

Cai, Yi; "Jitter Testing for Gigabit Serial Communication Transceivers," IEEE Design & Test of Computers, 2002, pp. 66-74, available from IEEE, 3 Park Avenue, 17th Floor, New York, New York 10016-5997 U.S.A.

* cited by examiner

*Primary Examiner*—Ilwoo Park
(74) *Attorney, Agent, or Firm*—W. Eric Webostad; John J. King; LeRoy D. Maunu

(57) ABSTRACT

Method and apparatus for communication within a programmable logic device using serial transceivers is described. In an example, an integrated circuit includes a first module and a second module. The first module and the second module each include a transceiver coupled to a serial/parallel interface, with each transceiver configured with at least one signal conductor for serial communication between the first module and the second module. The first module and the second module are configured to communicate with one another asynchronously. Each transceiver is configured to communicate with its respective serial/parallel interface in a synchronous time domain.

14 Claims, 4 Drawing Sheets

METHOD AND APPARATUS FOR COMMUNICATION WITHIN A PROGRAMMABLE LOGIC DEVICE USING SERIAL TRANSCEIVERS

FIELD OF THE INVENTION

One or more aspects of the invention relate generally to programmable logic devices, and more particularly, to communication within a programmable logic device using serial transceivers.

BACKGROUND OF THE INVENTION

Programmable logic devices (PLDs) exist as a well-known type of integrated circuit (IC) that can be programmed by a user to perform specified logic functions. There are different types of programmable logic devices, such as programmable logic arrays (PLAs) and complex programmable logic devices (CPLDs). One type of programmable logic device, called a field programmable gate array (FPGA), is popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream can be read from an external memory, conventionally an external integrated circuit memory such as EEPROM, EPROM, PROM, or the like, though other types of memory may be used. The collective states of the individual configuration memory cells then determine the function of the FPGA. In some cases, the designs implemented on an FPGA can be organized into modules, each module comprising a related group of programmable resources (e.g., CLBs, IOBs, and interconnect structure).

As feature size within an FPGA becomes smaller, especially for dense routing in sub-quarter-micron fabricated integrated circuits, globally synchronous communication at high clock frequencies over long-haul routing within an FPGA (such as FPGA internal module-to-module routing) is becoming more problematic. This difficulty is due at least in part to an increase in resistance-capacitance (RC) time constants. In some instances, none of the available paths of the interconnect structure from a source circuit to a sink circuit has a signal delay that is compatible with the desired clock period. That is, as clock frequencies increase, and delays in the interconnect structure also increase, a signal may not be able to propagate from one circuit to another within a target number of clock cycle(s). Thus, completely synchronous designs can become impractical, or even impossible.

Therefore, there exists a need in the art for point-to-point communication between respective portions of a programmable logic device integrated circuit, such as an FPGA, that facilitates module-to-module communication for an integrated circuit.

Additionally, it is desirable to facilitate communication over an interconnect structure with less delay to allow for "dynamic" or "on-the-fly" module configuration. Heretofore, at an interface, buffers were tri-stated to electrically isolate a module from one or more other modules while the isolated module was undergoing removal, initial or subsequent programming of programmable logic, or was not in use. This allowed such other modules to continue to operate, while taking a module undergoing configuration off-line.

SUMMARY OF THE INVENTION

Method and apparatus for communication within a programmable logic device using serial transceivers is described. In one embodiment, an integrated circuit includes a first module and a second module. The first module and the second module each include a transceiver coupled to a serial/parallel interface, with each transceiver configured to have at least one signal conductor for serial communication between the first module and the second module. The first module and the second module are configured to communicate with one another asynchronously. Each transceiver is configured to communicate with each of the serial/parallel interfaces in a synchronous time domain.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, and are for explanation and understanding only.

DETAILED DESCRIPTION OF THE DRAWINGS

Method and apparatus for communication within a programmable logic device are described in terms of field programmable gate arrays (FPGAs). While specific reference is made to FPGAs, those skilled in the art will appreciate that one or more aspects of the invention may be used in other types of programmable logic devices, such as complex programmable logic devices (CPLDs).

Figure 1:
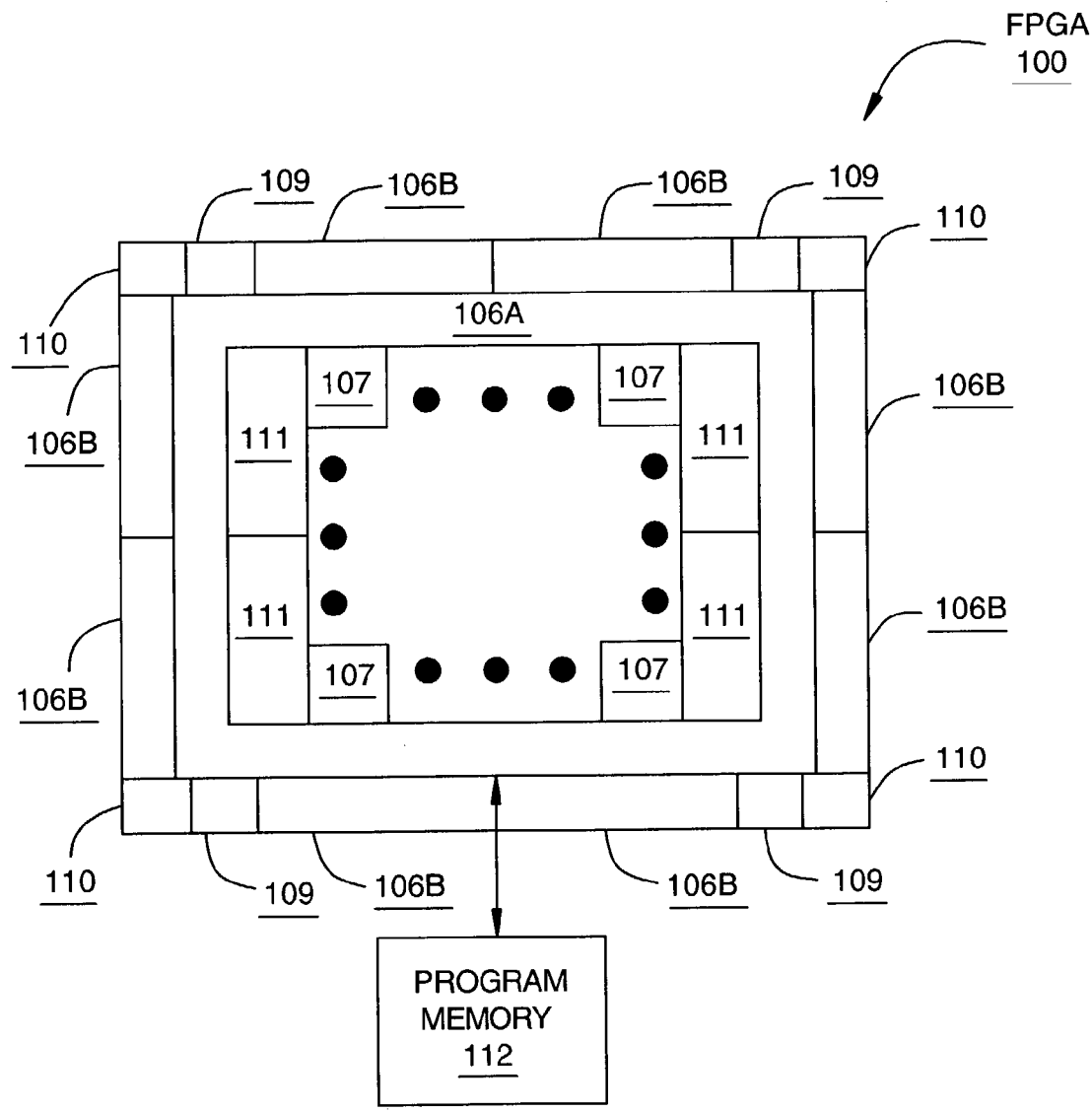
FIG. 1 depicts a block diagram of an exemplary embodiment of an FPGA in accordance with the invention coupled to a program memory.

FIG. 1 depicts a block diagram of an FPGA 100 with which the invention can be used coupled to a program memory 112. FPGA 100 illustratively includes CLBs 107, I/O routing ring 106A ("programmable interconnect"), memory 111, such as random access memory, delay lock loop (DLL) blocks 109, multiply/divide/de-skew clock circuits 110, and programmable IOBs 106B. DLL blocks 109 and clock circuits 110 collectively provide well-known digital clock management (DCM) circuits for managing clock signals within FPGA 100. Those skilled in the art understand that FPGA 100 may include other types of logic blocks and circuits, such as multipliers and processors, in addition to those described herein.

As is well known in the art, CLBs 107 are programmably connectable to each other, and to I/O routing ring 106A, for performing various types of logic functions. Each of CLBs 107 can include one or more "slices," and programmable interconnect circuitry (not shown). Each CLB slice in turn includes various circuits, such as flip-flops, function generators (e.g., a look-up table (LUT)), logic gates, memory, and other well-known circuits.

Programmable IOBs 106B are configured to provide input to, and receive output from, one or more of CLBs 107. Configuration information for FPGA 100, including CLBs 107, I/O routing ring 106A, and programmable IOBs 106B, is stored in memory 111. Briefly stated, a configuration bitstream produced from program memory 112 is coupled to a configuration port of FPGA 100 to implement a desired circuit therein. The configuration process of FPGA 100 is also well known in the art. CLBs 107, I/O routing ring 106A, and programmable IOBs 106B are collectively referred to herein as "FPGA fabric."

Figure 2:
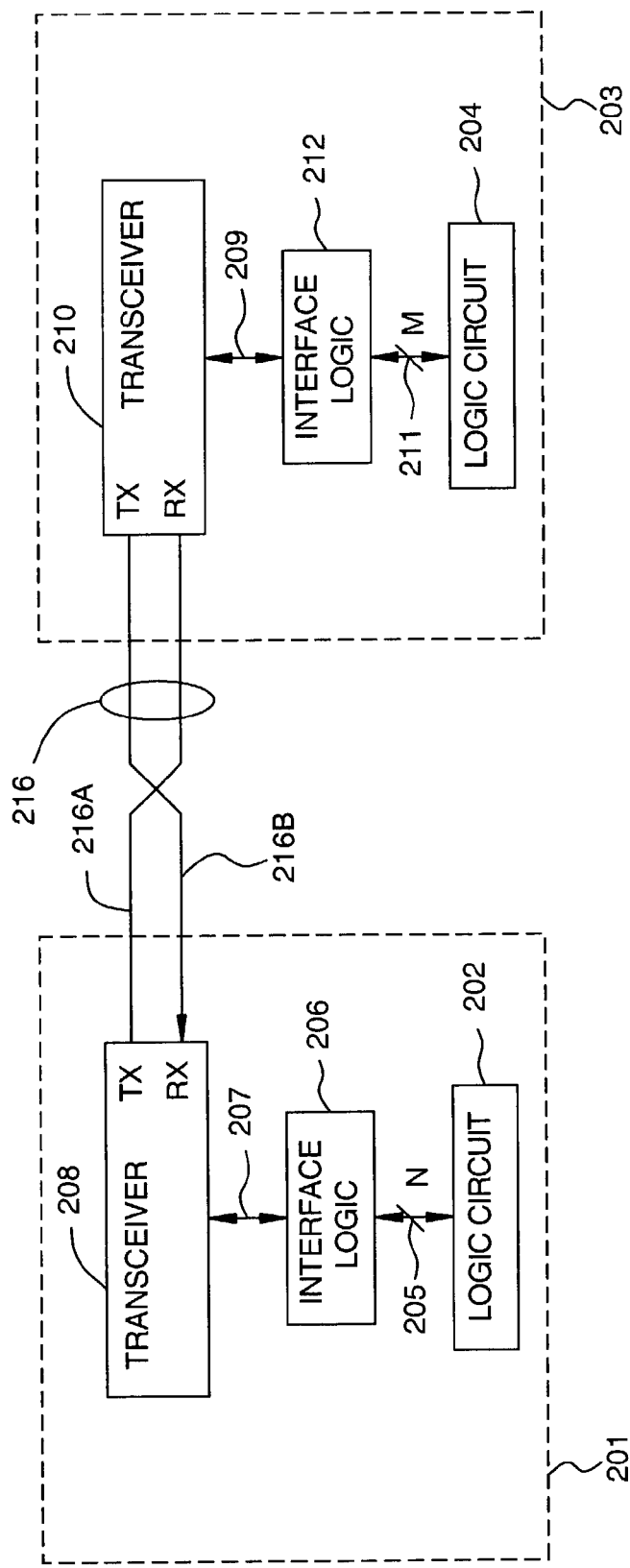
FIG. 2 depicts a block diagram showing an exemplary embodiment of a portion of an FPGA configured for internal communication in accordance with the invention.

FIG. 2 depicts a block diagram showing an exemplary embodiment of a portion of FPGA 100 configured for internal communication in accordance with one or more aspects of the invention. FPGA 100 includes a portion 201 in communication with a portion 203. Portion 201 includes a logic circuit 202, a transceiver 208, and interface logic 206. Portion 203 includes a logic circuit 204, a transceiver 210, and interface logic 212. Portion 201 is coupled to portion 203 via signal routing 216.

Logic circuit 202 is a circuit configured within FPGA 100 using the FPGA fabric as described above. Logic circuit 202 includes N I/O terminals 205, where N is an integer greater than zero. I/O terminals 205 of logic circuit 202 are coupled to interface logic 206. Interface logic 206 in turn is coupled to an I/O port 207 of transceiver 208. Likewise, logic circuit 204 is a circuit configured within FPGA 100 using the FPGA fabric. Logic circuit 204 includes M I/O terminals 211, where M is an integer greater than zero. I/O terminals 211 of logic circuit 204 are coupled to interface logic 212. Interface logic 212 is in turn coupled to an I/O port 209 or transceiver 210.

In one embodiment, transceiver 208 and transceiver 210 are asynchronous serial transceivers, such as multi-gigabit transceivers (MGTs), with differential inputs and outputs. Transceiver 208 and transceiver 210 are hardwired circuits within FPGA 100. Transceiver 208 is coupled to transceiver 210 via signal routing 216. In one embodiment, signal routing 216 is independent from the programmable interconnect of FPGA 100, namely, no programmable interconnect fabric of FPGA 100 is used for signal routing 216. For example, signal routing 216 may comprise a pair of signal paths, electrical or optical. For clarity, signal routing 216 is described in terms of circuit traces 216A and 216B. Circuit traces 216A and 216B couple transceiver 208 and transceiver 210 in a "cross-over" fashion. A transmit port of transceiver 208 is coupled to a receive port of transceiver 210 via circuit trace 216A. Likewise, a transmit port of transceiver 210 is coupled to a receive port of transceiver 208 via circuit trace 216B. In one embodiment, circuit traces 216A and 216B are formed within FPGA 100. Alternatively, circuit traces 216A and 216B may be formed on a printed circuit board (PCB), as described below with respect to FIG. 3.

Interface logic 206 provides an interface between logic circuit 202 and transceiver 208. Likewise, interface logic 212 provides an interface between logic circuit 204 and transceiver 210. Interface logic 206 and interface logic 212 serialize signals input from I/O terminals 205 and I/O terminals 211, respectively. Interface logic 206 and interface logic 212 respectively provide serialized bitstreams to transceiver 208 and transceiver 210.

Interface logic 206 and interface logic 212 also deserialize bitstreams input from I/O port 207 and I/O port 209, respectively. Interface logic 206 and interface logic 212 respectively provide deserialized signals to logic circuit 202 and logic circuit 204, which as indicated above, are parallel transmissions with N and M signal channels, respectively. Interface logic 206 and interface logic 212 can be implemented using FPGA fabric, or can be hardwired circuits within FPGA 100. Those skilled in the art will appreciate that interface logic 206 and interface logic 212 can be part of transceiver 208 and transceiver 210, respectively.

In operation, portion 201 of FPGA 100 communicates with portion 203 of FPGA 100 using transceiver 208 and transceiver 210. In one embodiment, transceiver 208 and transceiver 210 establish an asynchronous serial communication channel over signal routing 216 between portion 201 and portion 203. This allows portion 201 to communicate with portion 203, namely, FPGA portion-to-portion ("internal") communication, without using FPGA fabric.

For example, each of logic circuit 202 and logic circuit 204 can be designed to operate synchronously within a range of operating clock frequencies using FPGA fabric. Due to the clock frequency and/or the propagation delay, however, synchronous communication between logic circuit 202 and logic circuit 204 using FPGA fabric may not be achievable. As such, logic circuit 202 can be designed to communicate with logic circuit 204 using transceiver 208 and transceiver 210.

Using an asynchronous communication channel over signal routing 216, logic circuit 202 can transmit signals output from I/O terminals 205 to I/O terminals 211 of logic circuit 204. Likewise, logic circuit 204 can transmit signals output from I/O terminals 211 to I/O terminals 205 of logic circuit 202. In order to employ asynchronous communication more effectively between logic circuit 202 and logic circuit 204, interaction between logic circuit 202 and logic circuit 204 should be somewhat latency tolerant. By moving signals from a synchronous domain to an asynchronous domain, increased bandwidth from high-speed, asynchronous serial transmission is used to facilitate communication at the expense of some latency.

Thus, it should be appreciated that signal routing 216 is for module-to-module communication, or more generally point-to-point communication, where multiple asynchronous serial communication channels are employed. Physical connectivity of signal routing 216 for each communication channel can exist as a separate routing structure from FPGA fabric routing resources. Additionally, serial communications should have substantially uniform communication characteristics with respect to bandwidth, throughput and latency for enhanced effectiveness.

As mentioned above, it is desirable to support dynamic module configuration with communication within a programmable logic device integrated circuit, such as an FPGA, that facilitates module-to-module communication for an integrated circuit.

Figure 3:
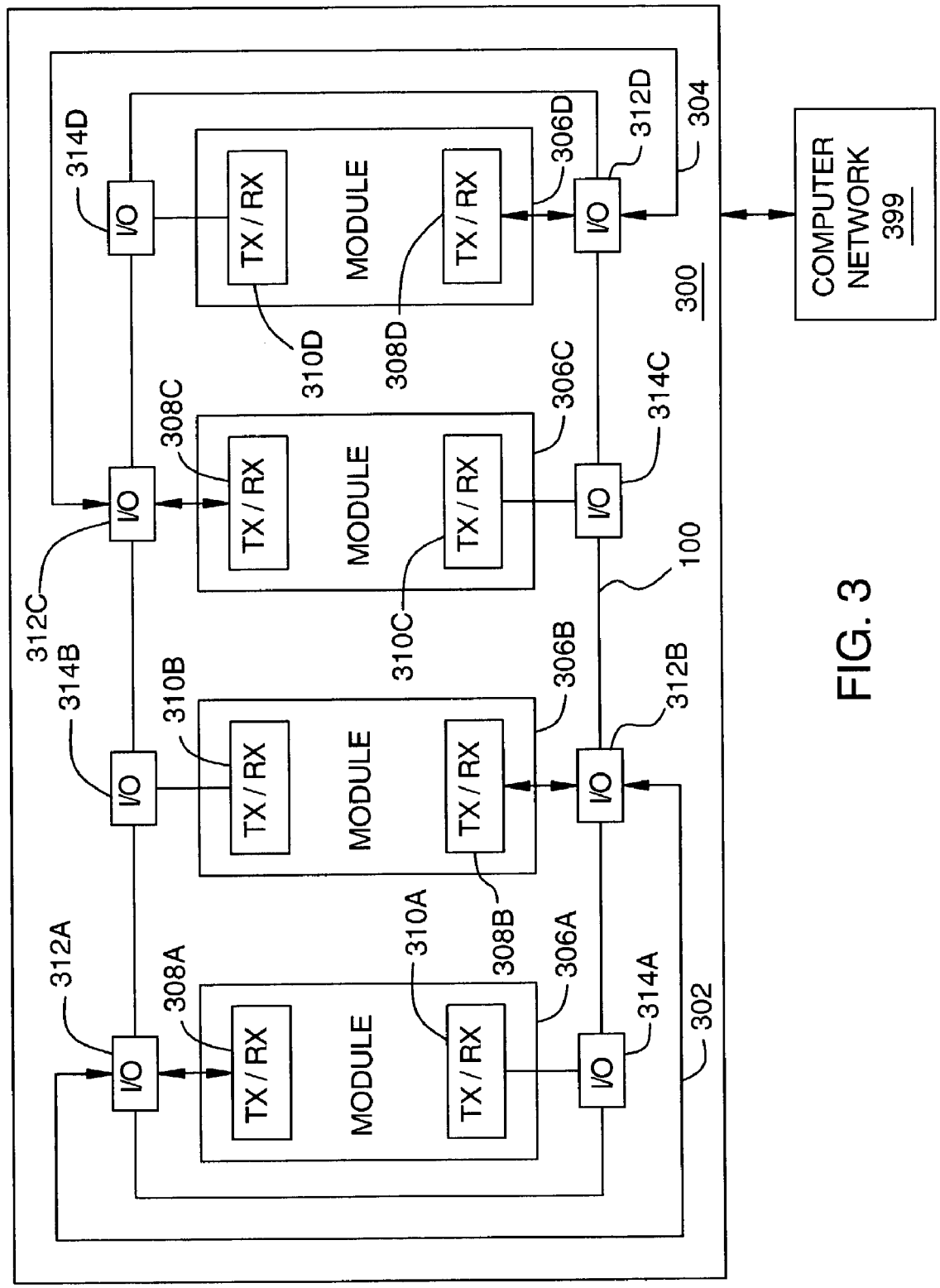
FIG. 3 depicts a block diagram of an exemplary portion of an FPGA configured for internal communication and dynamic module configuration.

FIG. 3 depicts a block diagram of an exemplary embodiment of at least a portion of FPGA 100 configured for internal communication and dynamic module configuration in accordance with one or more aspects of the invention. FPGA 100 includes a plurality of logic circuits ("modules"), illustratively modules 306A through 306D (generically referred to as modules 306). Each of modules 306 is a circuit configured within FPGA 100 using FPGA fabric as described above. Each of modules 306 includes a transceiver 308A through 308D (generically referred to as transceivers 308). Transceivers 308 are used for communication between modules 306 as described below. Each of modules 306 can include a transceiver 310A through 310D (generically referred to as transceivers 310). Transceivers 310 are coupled to I/O pins 314A through 314D (generically referred to as I/O pins 314), respectively, and can be used for communication with various external devices or systems, including a computer network 399, such as a private network or a public network like the Internet. I/O pins 314 are dedicated, namely, not part of IOBs of FPGA fabric.

Transceiver 308A is coupled to an I/O pin 312A of FPGA 100, and transceiver 308B is coupled to an I/O pin 312B of FPGA 100. I/O pin 312A is coupled to I/O pin 312B via signal routing 302. Likewise, transceiver 308C is coupled to an I/O pin 312C, and transceiver 308D is coupled to an I/O pin 312D. I/O pin 312C is coupled to I/O pin 312D via signal routing 304. I/O pins 312A through 312D are dedicated, and are not part of IOBs of FPGA fabric. Signal routing 302 and signal routing 304 are also independent from the FPGA fabric and can include a pair of circuit traces substantially as described above with respect to signal routing 216 of FIG. 2. In one embodiment, FPGA 100 is mounted to a PCB 300 and signal routing 302 is provided by traces formed on PCB 300. In this manner, module 306A can communicate with module 306B, and module 306C can communicate with module 306D, substantially as described above with respect to logic circuit 202 and logic circuit 204 of FIG. 2.

In one embodiment, modules 306 can be "dynamic modules" in that logic circuits forming modules 306 are dynamically configurable. That is, module 306A can be configured, including reconfigured, without affecting modules 306B through 306D, which may continue to operate during configuration or reconfiguration of module 306A. A module that is to be dynamically reconfigured is isolated from other modules before reconfiguration using programmable MGTs. In other words, transceivers 308 can be programmable MGTs, and can be programmed not to transmit or receive while a module 306 is to be isolated for reconfiguration. As modules 306 are coupled only through transceivers 308, 310, this arrangement facilitates isolation among modules 306. For example, module 306A is readily isolated from module 306B, since no portion of the FPGA fabric is used to connect module 306A to module 306B. After isolation, module 306A can be configured and then transceivers can be reprogrammed to put module 306A back into communication with one or more other modules 306 when configuration is complete.

Although four modules 306 have been shown, those skilled in the art will appreciate that fewer or more modules may be employed within FPGA 100. In general, a plurality of modules can be formed within FPGA 100, where any of the modules can be coupled to any other of the modules using dedicated ("static") signal routing. In addition, a given module can employ more than one transceiver for communicating with more than one other of the modules.

Figure 4:
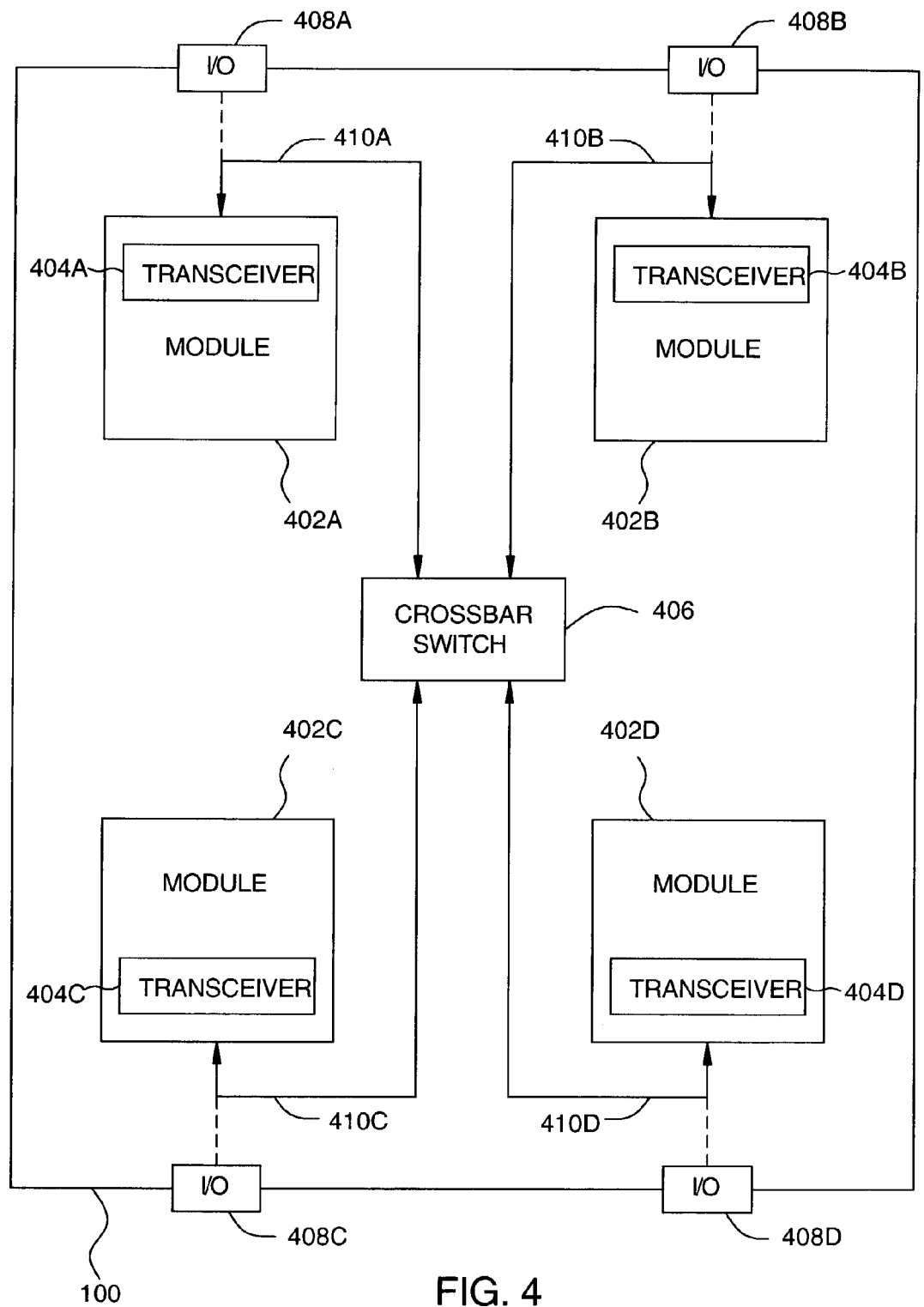
FIG. 4 depicts a block diagram of an exemplary portion of an FPGA configured for internal communication, dynamic module configuration, and re-routing in accordance with the invention.

FIG. 4 depicts a block diagram of an exemplary embodiment of at least a portion of FPGA 100 configured for internal communication and dynamic module configuration and re-routing in accordance with one or more aspects of the invention. FPGA 100 includes a plurality of modules 402A through 402D (generically referred to as modules 402). Each of modules 402 is a circuit configured within FPGA 100 using FPGA fabric as described above. Each of modules 402 respectively includes a programmable transceiver 404A through 404D (generically referred to as transceivers 404). Transceivers 404 are used for communication among modules 402. Transceivers 404 can be coupled to I/O pins 408A through 408D, respectively, for communication with external devices or systems, such as a network of computers.

Each of transceivers 404 is coupled to a crossbar switch 406 via signal routing 410A through 410D, respectively. Signal routing 410A through 410D is independent from the FPGA fabric and can include a pair of circuit traces substantially as described above with respect to signal routing 216 of FIG. 2. In one embodiment, crossbar switch 406 is a dedicated circuit within FPGA 100, and signal routing 410A through 410D comprises circuit traces formed within FPGA 100. In another embodiment, crossbar switch 406 can be implemented using the FPGA fabric, and signal routing 410A through 410D can be circuit traces formed within FPGA 100, or can be part of the general-purpose programmable routing of FPGA 100. In yet another embodiment, crossbar switch 406 and signal routing 410A through 410D can be formed off-chip on a PCB, such as PCB 300 of FIG. 3, on which FPGA 100 is mounted.

Crossbar switch 406 allows for programmable interconnection among modules 402. In particular, any one of modules 402 can be coupled to any other of modules 402 through crossbar switch 406. If it is on-chip, crossbar switch 406 can be implemented using FPGA fabric, a hardwired circuit embedded within FPGA 100, or a combination thereof. Notably, a full cross-bar switch need not be employed, and thus not all module-to-module connections may be possible. However, programmable transceivers 404 facilitate use of a full cross-bar switch between on-chip differential outputs of such transceivers 404, allowing all module-to-module combinations of connections for forming high-speed routes. Of course, the number of channels that cross-bar switch 406 can handle affects routing granularity. Additionally, as shown in FIG. 4, this is one-hop module-to-module connectivity; however, topologies other than one-hop may be used. For example, a cross-bar switch can be replaced by a segmented programmable routing architecture, though possibly with less uniformity of communication characteristics (e.g., bandwidth, throughput and latency). Furthermore, it should be understood that data passing through a cross-bar switch can be routed from one module to one or more modules.

Method and apparatus for communication within a programmable logic device using serial transceivers has been described. Transceivers are embedded within the PLD and establish point-to-point asynchronous serial communication channels between circuits configured within the PLD. The physical connection underlying the asynchronous communication channel can exist as a separate routing structure from the main routing resources of the PLD. Communication between two or more synchronous circuits is thus facilitated, where high clock frequencies employed within the synchronous circuits would have prohibited or made problematic synchronous inter-circuit communication. In addition, one or more on-chip modules can be programmably isolated to provide dynamic module configurable circuits from other circuits within a PLD.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps.

What is claimed is:

1. A system for inter-module communication, comprising:
a printed circuit board having traces;

a cross-bar switch integrated circuit attached to said printed circuit board for electrical communication among said traces; and a programmable logic device integrated circuit attached to said circuit board for electrical communication over said traces, said programmable logic device integrated circuit including a first module and a second module, said first module and said second module each including a hardwired transceiver coupled to a serial/parallel interface, each said transceiver configured with at least one signal conductor for serial communication between said first module and said second module over said traces and through said cross-bar switch, said first module and said second module being configured to communicate with one another asynchronously, each said transceiver being configured to communicate with a respective said serial/parallel interface in a synchronous time domain, each said serial/parallel interface being coupled to a respective portion of programmable logic of said programmable logic device.

2. A system as in claim 1, wherein said programmable logic device integrated circuit is a field programmable gate array.

3. A system as in claim 2, wherein each said transceiver is a multi-gigabit transceiver.

4. A system as in claim 1, wherein at least one said transceiver is programmable to block and unblock communication thereto and therefrom.

5. A system as in claim 1, wherein said first module and said second module are configured for said serial communication with one another over a plurality of communication channels via said traces.

6. A programmable logic device (PLD), comprising:
an integrated circuit including, a configuration memory arranged for storage of bit values that program functions of programmable logic resources and programmable interconnect resources of the PLD;
a plurality of programmable logic resources coupled to the configuration memory;
a plurality of programmable interconnect resources coupled to the configuration memory and to the programmable logic resources;
a first hardwired transceiver and a second hardwired transceiver coupled by at least two dedicated, non-programmable signal lines; and
the first hardwired transceiver arranged to be coupled to a first set of programmable logic resources via a first set of programmable interconnect resources, and adapted to convert parallel data received from the first set of programmable logic resources to serial data and transmit the serial data to the second transceiver, and convert serial data received from the second transceiver to parallel data and output the parallel data to the first set of programmable logic resources.

7. The PLD of claim 6, wherein the second transceiver is arranged to be coupled to a second set of programmable logic resources via a second set of programmable interconnect resources, and is adapted to convert parallel data received from the second set of programmable logic resources to serial data and transmit the serial data to the first transceiver, and convert serial data received from the first transceiver to parallel data and output the parallel data to the second set of programmable logic resources.

8. The PLD of claim 7, wherein the first and second transceivers are multi-gigabit transceivers.

9. The PLD of claim 8, further comprising:
a plurality of programmable I/O resources coupled to the configuration memory and to the interconnect resources, the I/O resources including a first set of I/O pins;
a second set of I/O pins including at least a first I/O pin coupled to and dedicated to the first transceiver and a second I/O pin coupled to and dedicated to the second transceiver.

10. The PLD of claim 6, wherein the first transceiver is programmable to disable communication with the second transceiver during reconfiguration of the first set of programmable logic resources.

11. A programmable logic device (PLD), comprising:
an integrated circuit including, a configuration memory arranged for storage of bit values that program functions of programmable logic resources and programmable interconnect resources of the PLD;
a plurality of programmable logic resources coupled to the configuration memory;
a plurality of programmable interconnect resources coupled to the configuration memory and to the programmable logic resources;
a plurality of hardwired transceivers, each coupled to a respective pair of dedicated, non-programmable signal lines, a first line of each pair for transmitting and a second line of each pair for receiving;
a cross-bar switch coupled to the pairs of dedicated, non-programmable signal lines and adapted to switchably connect the hardwired transceivers; and
each hardwired transceiver arranged to be coupled to a respective set of programmable logic resources via a respective set of programmable interconnect resources, and adapted to convert parallel data received from the respective set of programmable logic resources to serial data and transmit the serial data to one of the transceivers, and convert serial data received from one of the transceivers to parallel data and output the parallel data to the respective set of programmable logic resources.

12. The PLD of claim 11, wherein each of the plurality of transceivers is a multi-gigabit transceiver.

13. The PLD of claim 11, further comprising:
a plurality of programmable I/O resources coupled to the configuration memory and to the interconnect resources, the I/O resources including a first set of I/O pins;
a second set of I/O pins including respective I/O pins coupled to and dedicated to the plurality of transceivers.

14. The PLD of claim 11, wherein each transceiver is programmable to disable communication with the other transceivers during reconfiguration of the respective set of programmable logic resources to which the transceiver is arranged to be coupled.

* * * * *